United States Patent
Gauthier et al.

(10) Patent No.: US 6,806,698 B2
(45) Date of Patent: Oct. 19, 2004

(54) QUANTIFYING A DIFFERENCE BETWEEN NODAL VOLTAGES

(75) Inventors: Claude Gauthier, Fremont, CA (US); Brian Amick, Austin, TX (US); Spencer Gold, Pepperell, MA (US); Dean Liu, Sunnyvale, CA (US); Kamran Zarrineh, Billerica, MA (US); Pradeep Trivedi, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 62 days.

(21) Appl. No.: 10/078,945

(22) Filed: Feb. 19, 2002

(65) Prior Publication Data

US 2003/0155903 A1 Aug. 21, 2003

(51) Int. Cl.$^7$ ............................................. G01R 23/14
(52) U.S. Cl. .............................. 324/76.41; 324/76.48; 377/25
(58) Field of Search ........................... 324/76.41–76.48; 377/19, 25

(56) References Cited

U.S. PATENT DOCUMENTS

| | | | |
|---|---|---|---|
| 3,379,214 A | | 4/1968 | Weinberg ............... 137/625.5 |
| 4,150,573 A | * | 4/1979 | Iinuma et al. .............. 324/707 |
| 4,165,642 A | | 8/1979 | Lipp ........................... 73/362 |
| 4,201,087 A | | 5/1980 | Akita et al. .................... 73/339 |
| 4,305,041 A | | 12/1981 | Frerking ..................... 328/155 |
| 4,371,271 A | | 2/1983 | Bellet ......................... 374/183 |
| 4,551,031 A | | 11/1985 | Ishikawa et al. ............ 374/117 |
| 4,559,954 A | | 12/1985 | Murase ....................... 128/736 |
| 4,658,407 A | | 4/1987 | Iwama ........................ 377/25 |
| 4,692,710 A | | 9/1987 | Shvartsman ................ 328/111 |
| 4,754,760 A | | 7/1988 | Fukukita et al. ............ 128/660 |
| 4,905,701 A | | 3/1990 | Cornelius .............. 128/660.01 |
| 4,929,890 A | * | 5/1990 | Bell et al. ................. 324/76.48 |
| 5,085,526 A | | 2/1992 | Sawtell et al. .............. 374/101 |
| 5,097,198 A | | 3/1992 | Holmdahl ................... 323/280 |
| 5,193,387 A | | 3/1993 | Hodate ....................... 73/146.5 |
| 5,214,668 A | | 5/1993 | Satou et al. ................ 374/117 |
| 5,291,607 A | | 3/1994 | Ristic et al. ................. 395/750 |
| 5,442,669 A | * | 8/1995 | Medin .......................... 377/20 |
| 5,485,127 A | | 1/1996 | Bertoluzzi et al. ............ 331/69 |
| 5,490,059 A | | 2/1996 | Mahalingaiah et al. ..... 364/166 |
| 5,546,810 A | | 8/1996 | Arikawa et al. .............. 73/702 |
| 5,626,425 A | | 5/1997 | Fujikawa et al. ........... 374/163 |
| 5,638,418 A | | 6/1997 | Douglass et al. ............. 377/25 |
| 5,686,835 A | * | 11/1997 | Watanabe et al. ........ 324/76.48 |
| 5,781,075 A | | 7/1998 | Bolton, Jr. et al. ......... 331/176 |
| 5,781,718 A | | 7/1998 | Nguyen ................. 395/183.09 |
| 5,832,048 A | | 11/1998 | Woodman, Jr. ............. 375/376 |

(List continued on next page.)

OTHER PUBLICATIONS

Gunther et al. "Managing the impact of increasing microprocessor power consumption." pp. 1–9 http://www.intel.com/technology/iti/g12001/articles/art 4.htm (2001) Intel Technology Journal Q1.

(List continued on next page.)

Primary Examiner—Anjan Deb
Assistant Examiner—Timothy J. Dole
(74) Attorney, Agent, or Firm—Osha & May L.L.P.

(57) ABSTRACT

A method and apparatus that uses the difference between two nodal voltages, such as a temperature-independent voltage and a temperature-dependent voltage, to determine the actual temperature at a point on an integrated circuit is provided. Further, a method and apparatus that converts a difference between nodal voltages in an integrated circuit from an analog to a digital quantity on the integrated circuit such that the difference in voltage may be used by an on-chip digital system is provided. Further, a method and apparatus for quantifying a difference in voltage between a first node and a second node of a temperature sensor is provided.

6 Claims, 5 Drawing Sheets

U.S. PATENT DOCUMENTS

| | | | |
|---|---|---|---|
| 5,836,691 A | 11/1998 | Yamauchi | 374/117 |
| 5,838,578 A | 11/1998 | Pippin | 364/488 |
| 5,870,614 A | 2/1999 | Ang | 395/750.03 |
| 5,873,053 A | 2/1999 | Pricer et al. | 702/130 |
| 5,892,408 A | 4/1999 | Binder | 331/44 |
| 5,892,448 A | 4/1999 | Fujikawa et al. | 340/584 |
| 5,899,570 A * | 5/1999 | Darmawaskita et al. | 374/170 |
| 5,933,039 A | 8/1999 | Hui et al. | 327/262 |
| 5,953,640 A | 9/1999 | Meador et al. | 455/73 |
| 6,098,030 A | 8/2000 | McMinn | 702/132 |
| 6,115,441 A | 9/2000 | Douglass et al. | 377/25 |
| 6,219,723 B1 | 4/2001 | Hetherington et al. | 710/18 |
| 6,362,699 B1 | 3/2002 | Fry | 331/176 |
| 6,363,490 B1 | 3/2002 | Senyk | 713/300 |
| 6,463,396 B1 | 10/2002 | Nishigaki | 702/132 |
| 2001/0021217 A1 | 9/2001 | Gunther et al. | 374/178 |
| 2003/0052331 A1 | 3/2003 | Gauthier et al. | 257/168 |
| 2003/0155903 A1 | 8/2003 | Gauthier et al. | 324/73.41 |
| 2003/0155964 A1 | 8/2003 | Gauthier et al. | 327/540 |
| 2003/0155965 A1 | 8/2003 | Gauthier et al. | 327/540 |
| 2003/0156622 A1 | 8/2003 | Gold et al. | 374/170 |
| 2003/0158683 A1 | 8/2003 | Gauthier et al. | 702/99 |
| 2003/0158696 A1 | 8/2003 | Gold et al. | 702/132 |
| 2003/0158697 A1 | 8/2003 | Gold et al. | 702/132 |

OTHER PUBLICATIONS

Intel Corporation "Mobile Pentium II Processor and Pentium II Processor Mobile Module Thermal Sensor Interface specifications." 13 pages (Apr. 1988) http://www.intel.com/design/mobile/applnots/24372401.pdf.

"High Resolution Temperature Measurement with Dallas Direct–to–Digital Temperature Sensors" Dallas Semiconductor Application Note 105, pp. 1–20.

"Intel Pentium 4 Processor in the 423–pin Package Termal Design Guidelines" Order No. 249203–001 Nov., 2000, pp. 1–28.

"Remote/Local Temperature Sensor with SMBus Serial Interface" Maxim MAX1617 19–1265; Rev 1: 3/98, pp. 1–20.

"2–Wire Digital Termometer and Thermostat" Dallas Semiconductor DS1721 Dec. 29, 1998 1/14, pp. 1–14.

* cited by examiner

US 6,806,698 B2

QUANTIFYING A DIFFERENCE BETWEEN NODAL VOLTAGES

BACKGROUND OF INVENTION

This application contains subject matter that may be related to that contained in the following U.S. applications filed on Feb. 19, 2002 and assigned to the assignee of the instant application: "A Method and System for Monitoring and Profiling an Integrated Circuit Die Temperature" (Ser. No. 10/079,476), "An Integrated Temperature Sensor" (Ser. No. 10/080,037), "A Controller for Monitoring Temperature" (Ser. No. 10/079,475), "Temperature Calibration Using On-Chip Electrical Fuses" (Ser. No. 10/078,760), "Low Voltage Temperature-Independent and Temperature-Dependent Voltage Generator" (U.S. Pat. No. 6,605,988), and "Increasing Supply Noise Rejection Using Voltage Regulators in an On-Chip Temperature Sensor" (Ser. No. 10/078,130).

As shown in FIG. 1, monolithic integrated circuits (10) are fabricated several at a time on single chips (or "wafers") (12) of silicon or dice (the singular being "die"). This means that the passive and active structures of the integrated circuits (10) are manufactured all at the same time, thus ensuring that a large number of structures are identical, or bear some fixed ratio to one another. However, it is difficult to ensure that the electrical characteristics among the integrated circuits (10) are precisely the same. Thus, in effect, two integrated circuits (10) fabricated next to one another may have slightly different electrical characteristics. Such phenomena are known as process, or manufacturing, variations.

One particular variation that a chip designer has to compensate for involves those process variations that affect temperature measurements of an integrated circuit. It is becoming increasingly important to know the temperature parameters within which a particular integrated circuit operates because increased operating temperatures create a propensity for performance reliability degradation.

Because temperature considerations play a large part in the chip design process, it is imperative that a chip designer be able to make accurate temperature measurements of an integrated circuit. FIG. 2 shows a typical technique used to measure temperatures involving the use of a temperature-dependent voltage (Vprop in FIG. 2) to alter the frequency of a voltage controlled oscillator. A temperature-sensitive transistor (16) is disposed on a microprocessor (14) in order to measure temperature at a point on the microprocessor (14). The temperature-sensitive transistor (16) generates a temperature-dependent voltage (18) whose voltage is proportional to the temperature at the point at which the voltage generator (16) resides. The temperature-sensitive transistor (18) is used to control a voltage-controlled oscillator (VCO) (20), which acts as a voltage-to-frequency converter. The voltage-controlled oscillator (20) converts the temperature-dependent voltage (18) to an oscillating analog frequency (22) that is driven off of the microprocessor (14) to an off-chip measuring device (24).

This technique is prone to inaccuracy because the voltage-controlled oscillator (20) itself is susceptible to process variations. As a result, the oscillating analog frequency (22) generated by the voltage-controlled oscillator (20) may be an inaccurate representation of the voltage that is proportional to temperature (Vprop). In addition, digital circuitry of the microprocessor (14) cannot take advantage of Vprop represented by the oscillating analog frequency (22) because the oscillating analog frequency (22) is not converted from an analog quantity to a digital quantity, i.e., quantified, on the microprocessor (14). Thus, there is a need for a method of canceling process variations from the oscillating analog frequency (22), and a need for a method of quantifying Vprop on the microprocessor (14).

SUMMARY OF INVENTION

According to one aspect of the present invention, an apparatus for quantifying a difference in voltage between a temperature-independent voltage and a temperature-dependent voltage generated by a voltage generator comprises a first oscillator that inputs the temperature-independent voltage, where the first oscillator generates a first oscillating frequency based on the temperature-dependent voltage; a second oscillator that inputs the temperature-dependent voltage, where the second oscillator generates a second oscillating frequency based on the temperature-dependent voltage; and a comparator that compares the first oscillating frequency and the second oscillating frequency and generates a digital word representative of a difference between the first oscillating frequency and the second oscillating frequency.

According to another aspect, an apparatus for quantifying a difference in voltage between a first nodal voltage and a second nodal voltage generated by a voltage generator comprises means for generating a first oscillating frequency based on the first nodal voltage; means for generating a second oscillating frequency based on the second nodal voltage; and means for generating a digital word representative of a comparison of the first and second oscillating frequencies.

According to another aspect, a method for quantifying a difference in voltage between a first nodal voltage and a second nodal voltage generated by a voltage generator comprises generating a first oscillating frequency based on the first nodal voltage, where the first oscillating frequency is generated with a first oscillator; generating a second oscillating frequency based on the second nodal voltage, where the second oscillating frequency is generated with a second oscillator; and generating a digital word in relation to the first and second oscillating frequencies, where the digital word is generated with a comparator.

Other aspects and advantages of the invention will be apparent from the following description and the appended claims.

DETAILED DESCRIPTION

Embodiments of the present invention relate to a method and apparatus for quantifying a difference in voltage between nodal voltages in an integrated circuit. Embodiments of the present invention further relate to a method and apparatus for converting a difference in voltage between nodal voltages in an integrated circuit from an analog to a digital quantity on the integrated circuit so that the difference in voltage may be used by an on-chip digital system. Embodiments of the present invention further relate to a method for quantifying a difference in voltage between a first node and a second node of a temperature sensor.

Embodiments of the present invention use the difference between two nodal voltages, such as a temperature-independent voltage and a temperature-dependent voltage, to determine the actual temperature at a point on an integrated circuit. The temperature-independent voltage and the temperature-dependent voltage are converted into oscillating frequencies by voltage-controlled oscillators ("VCOs"). Frequency inaccuracies, which are introduced to the oscillating frequencies by process variations in the VCOs, are canceled from the temperature-dependent oscillating frequency by using the temperature-independent oscillating frequency as a reference frequency.

Pulses in the oscillating frequencies are counted for a fixed period of time to produce binary quantities representing the temperature-dependent and temperature-independent voltages. The difference between the binary quantities presents a digital word proportional to the difference between the temperature-dependent and temperature-independent voltages. Because the digital word is computed on-chip, it can be used by a digital system on the integrated circuit. As a result, the integrated circuit may access temperature measurements represented by the temperature-dependent voltage. Thus, embodiments of the present invention (1) convert nodal voltages generated at a point on an integrated circuit, such as a temperature-dependent voltage and a temperature-independent voltage, into oscillating frequencies, (2) count pulses in the oscillating frequencies for a fixed period of time to produce binary quantities, and (3) generate a digital word based on a difference between the binary quantities that may be used by a digital system of the integrated circuit.

Figure 1:
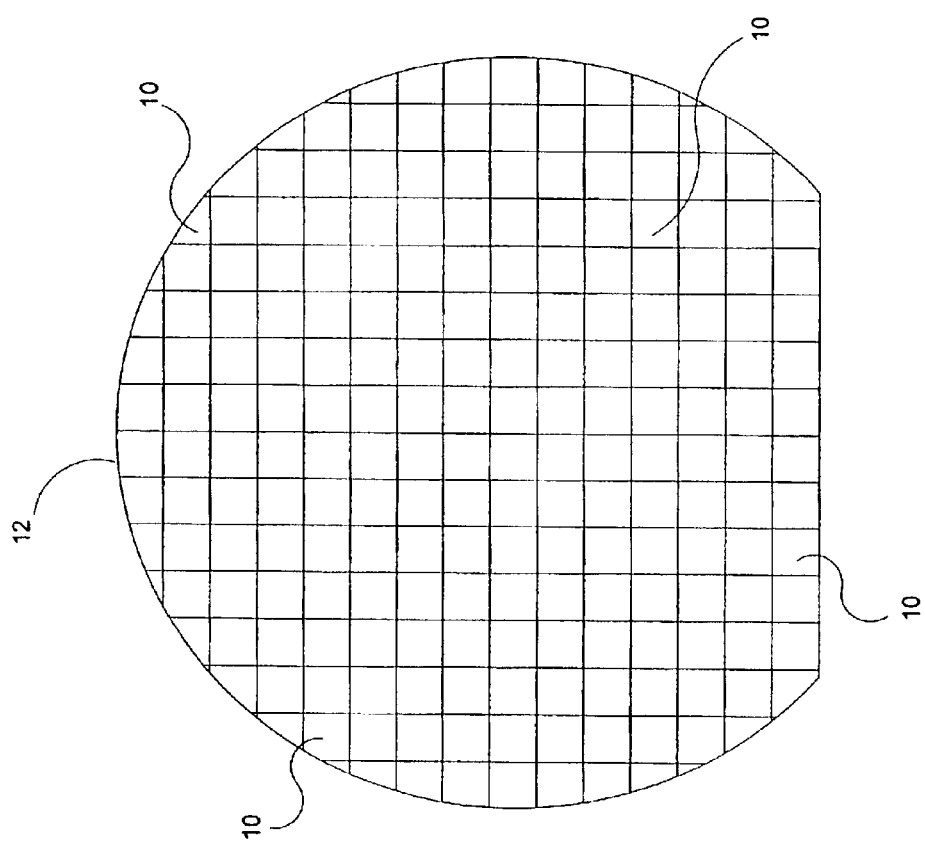
FIG. 1 shows a typical silicon wafer used to fabricate integrated circuits.
Figure 2:
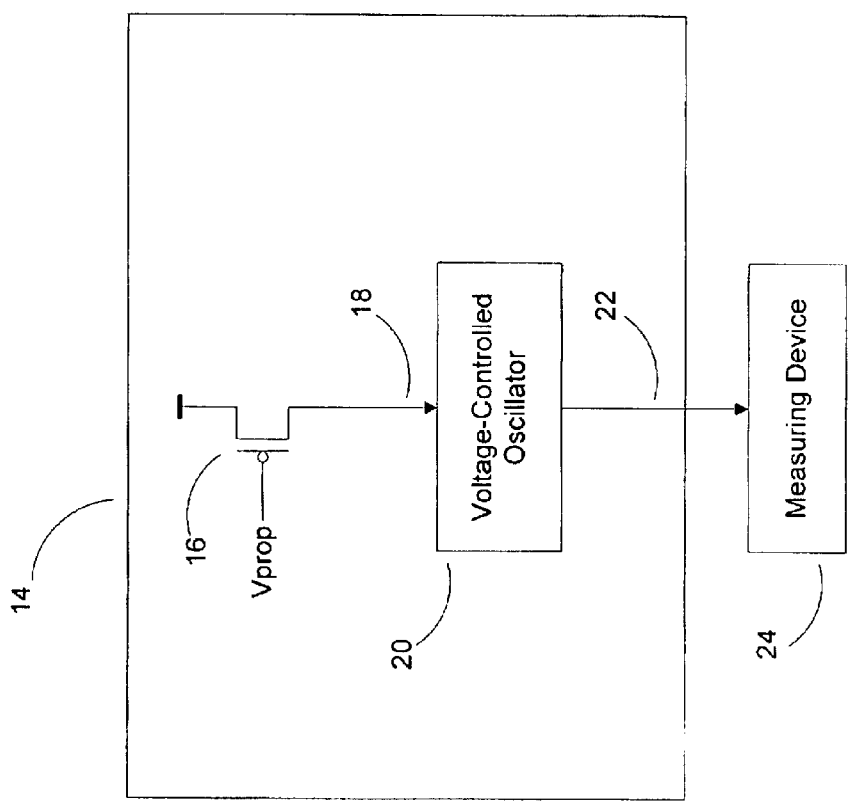
FIG. 2 shows a typical technique used to quantify temperature measurements taken on an integrated circuit.
Figure 3:
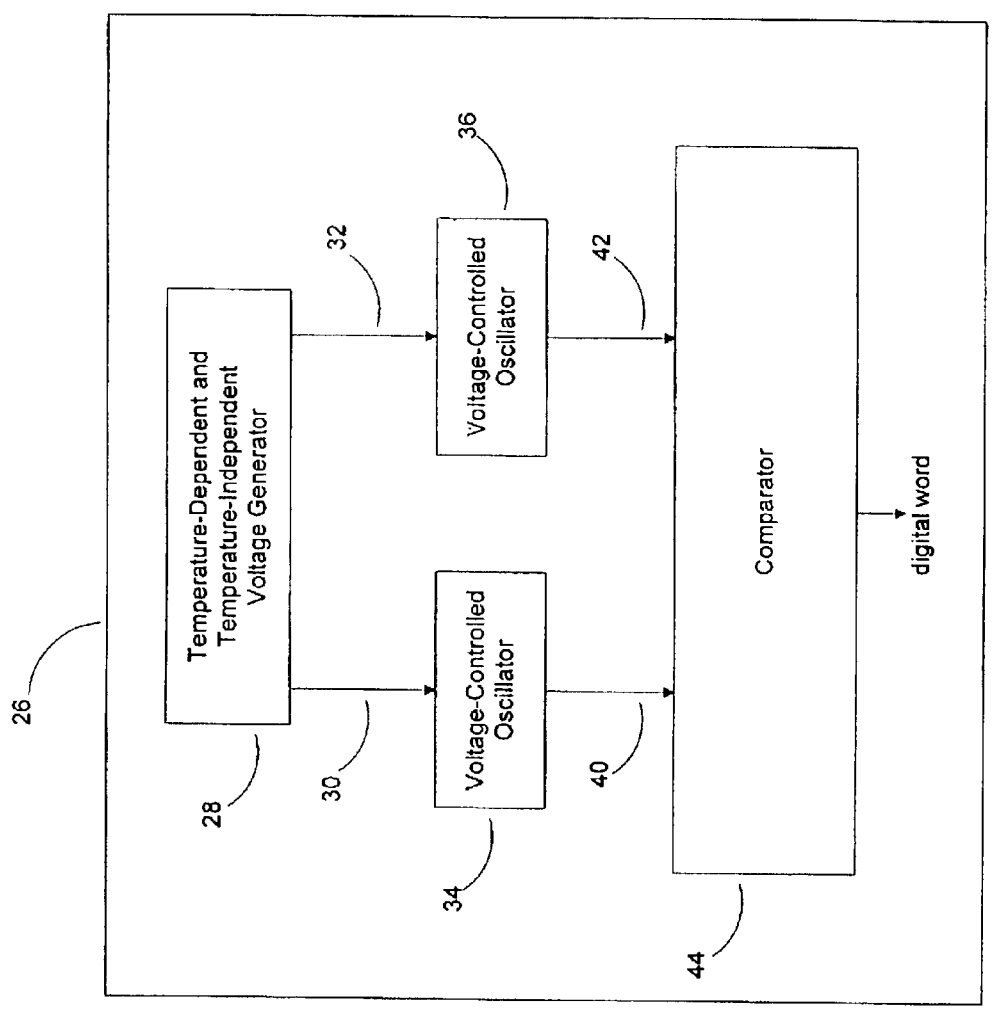
FIG. 3 shows a nodal voltage quantification technique in accordance with an embodiment of the present invention.

FIG. 3 depicts an exemplary nodal voltage quantification technique in accordance with an embodiment of the present invention. As shown in FIG. 3, an integrated circuit (26) has a voltage generator (28) of an on-chip temperature sensor, VCOs (34, 36), and a comparator (44). Nodal voltages, such as a temperature-dependent voltage (30) and a temperature-independent voltage (32) generated by the voltage generator (28), are each fed into the VCOs (34, 36), respectively. Each VCO (34, 36) converts the nodal voltage fed into it to an oscillating frequency. In particular, the temperature-dependent voltage (30) is converted into a temperature-dependent oscillating frequency (40) by the first VCO (34), while the temperature-independent voltage (32) is converted into a temperature-independent oscillating frequency (42) by the second VCO (36). The temperature-dependent oscillating frequency (40) and the temperature-independent oscillating frequency (42) are quantified by the comparator (44). The comparator (44): (1) generates two binary quantities (one for each oscillating frequency); and (2) computes a digital word using the binary quantities. Because the digital word is computed on the integrated circuit of which temperature measurements were taken, the digital word can be used by an on-chip digital system.

Figure 4:
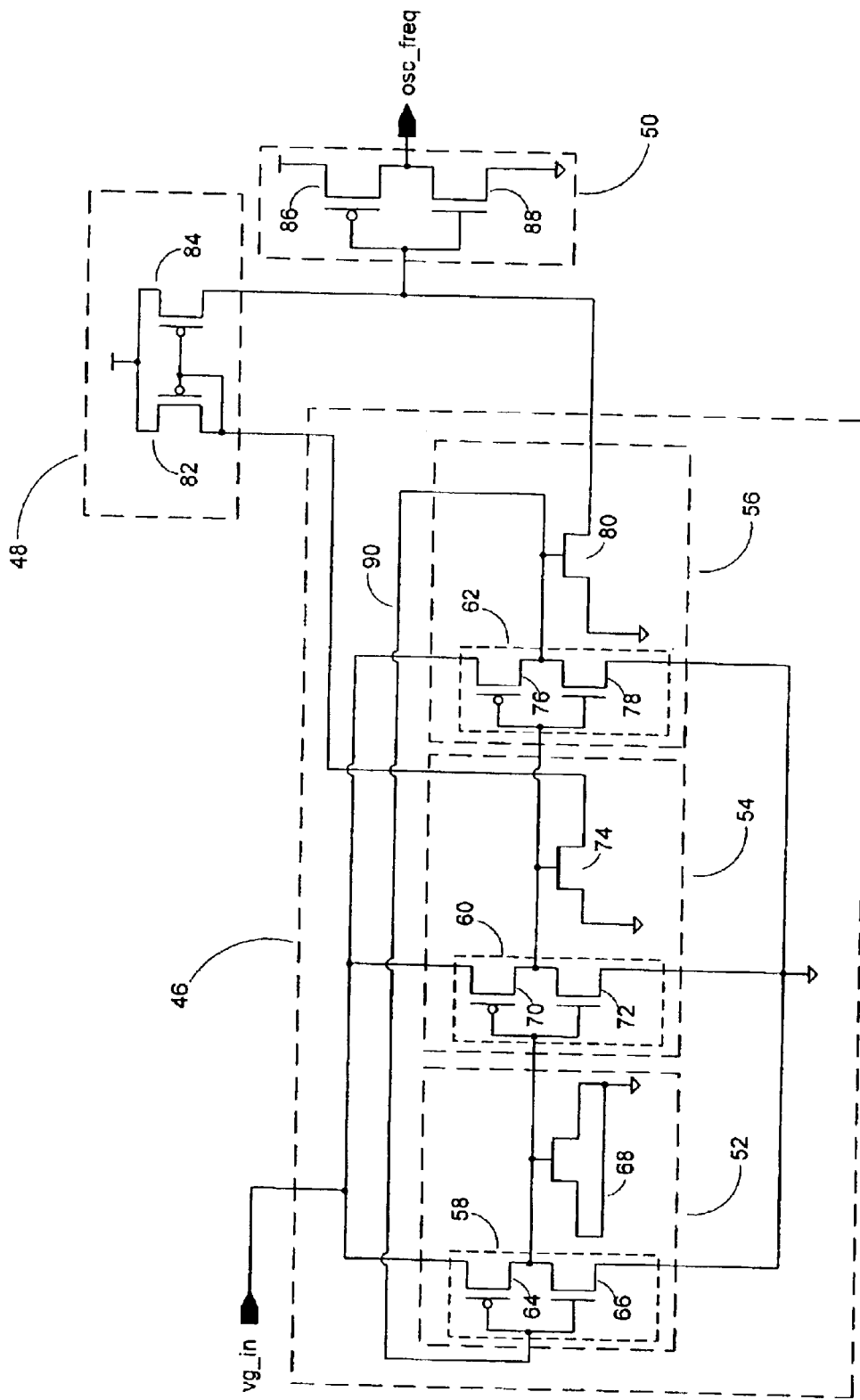
FIG. 4 shows a voltage-controlled oscillator in accordance with an embodiment of the present invention.

FIG. 4 shows an exemplary VCO in accordance with an embodiment of the present invention. The VCO may embody either the first VCO (34) or the second VCO (36) of FIG. 3. The VCO uses a ring oscillator formed of a series of inverters to convert an input vg_in into an output osc_freq. In the first VCO (34) of FIG. 3, the temperature-dependent voltage (30) serves as the vg_in input and the temperature-dependent oscillating frequency (40) serves as the osc_freq output, while in the second VCO (36) of FIG. 3, the temperature-independent voltage (32) serves as the vg_in input and the temperature-independent oscillating frequency (42) serves as the osc_freq output.

Referring again to FIG. 4, the VCO has an oscillator stage (46), a load stage (48), and an inverter stage (50). The oscillator stage (46) converts input vg_in into an oscillating frequency using its ring oscillator. The ring oscillator has the following delay stages: a first delay stage (52), a second delay stage (54), and a last delay stage (56), wherein the output of the last delay stage (56) is fed into the first delay stage (52) by a feedback path (90). The first delay stage (52) feeds input into the second delay stage (54), and the second delay stage feeds input into the last delay stage (56). Further, the first, second, and last delay stages (52, 54, 56) each have a current-starved inverter (58, 60, 62) formed by first transistor (64, 70, 76) attached to vg_in and a second transistor (66, 72, 78) attached to ground.

The inverters (58, 60, 62) convert vg_in into an oscillating frequency through alternating high-to-low and low-to-high transitions. Because the rate at which the inverters (58, 60, 62) transition between high and low is directly proportional to the voltage of vg_in, the frequency at which the oscillating frequency oscillates is also proportional to the voltage of vg_in. In addition, the voltage outputted by each current-starved inverter (58, 60, 62) is inputted to a third transistor (68, 74, 80). In the second and last delay stages (54, 56), the third transistors (74, 80) are active transistors that together output a differential version of the oscillating frequency to the load stage (48). In the first delay stage (52), the third transistor is a dummy transistor used to match the capacitance seen by the first delay stage's inverter (58) to the capacitance seen by the second delay stage's inverter (60) and the last delay stage's inverter (62).

The differential current is converted to voltage using the load stage (48). The current-mirror load formed by the transistors (82, 84) is used to convert the two differential oscillating frequencies outputted by the oscillator stage (46) into a single-ended oscillating frequency, which is inputted to the inverter stage (50).

The inverter stage (50) of the VCO is formed by two transistors (86, 88) that form an inverter having an output osc_freq. The inverter is used to buffer the single-ended oscillating frequency before it is outputted from the inverter stage (50) as osc_freq. The output osc_freq serves as an output of the VCO. The output osc_freq may embody either the temperature-dependent oscillating frequency (40) or the temperature-independent oscillating frequency (42) of FIG. 3.

Figure 5:
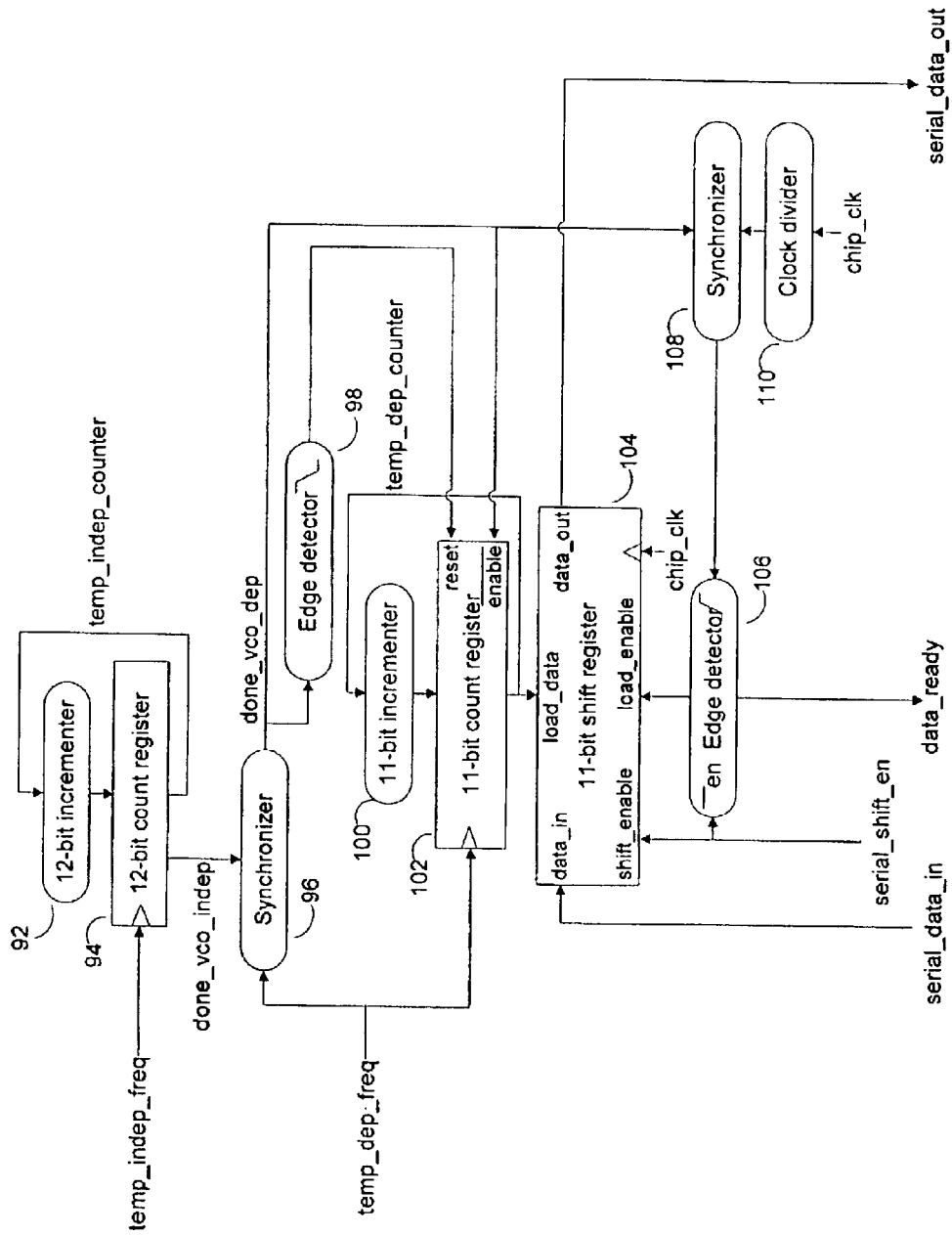
FIG. 5 shows a comparator in accordance with an embodiment of the present invention.

FIG. 5 shows an exemplary comparator in accordance with an embodiment of the present invention. The comparator inputs a temp_indep_freq signal, which embodies the temperature-independent oscillating frequency (42) of FIG. 3, and a temp_dep_freq signal, which embodies the temperature-dependent oscillating frequency (40) of FIG. 3. By design, temp_indep_freq oscillates a higher frequency than temp_dep_freq.

Referring again to FIG. 5, the comparator uses a 12-bit count register (92) and a 12-bit incrementer (94) to generate a binary quantity, i.e., a counter, that represents temp_indep_freq. The temp_indep_freq clocks the 12-bit count register (92), which is used to save a counter shown as temp_indep_counter. The value of temp_indep_counter represents the number of positive transitions in temp_indep_freq that have occurred since the last time the temp_indep_counter was reset to zero. On each positive transition of temp_indep_freq, the 12-bit count register (92) outputs the most recently saved value of temp_indep_counter to the 12-bit incrementer (94). The 12-bit incrementer (94) increments the most recently saved value of temp_indep_counter by one and sends the incremented value to the 12-bit count register (92). Then, the 12-bit count register (92) replaces the most recently saved value of temp_indep_counter with the incremented value.

In order to produce a binary quantity that represents temp_dep_freq, the comparator uses an 11-bit count register (102) and an 11-bit incrementer (100). The temp_dep_freq clocks the 11-bit count register (102), which is used to save a counter shown as temp_dep_counter. The value of temp_dep_counter represents the number of positive transitions in temp_dep_freq that have occurred since the last time temp_dep_counter was reset to zero. Because temp_dep_freq is temperature-dependent, the temp_dep_counter also represents a temperature measurement taken by the temperature sensor. Again, on each positive transition of temp_dep_freq, the 11-bit count register (102) outputs the most recently saved value of temp_dep_counter to an 11-bit incrementer (100). The 11-bit incrementer (100) increments the most recently saved value of temp_dep_counter by one and sends the incremented value to the 11-bit count register (102). Then, the 11-bit count register (102) replaces the most recently saved value of temp_dep_counter with the incremented value.

When the value of the temp_indep_counter saved by the 12-bit count register (92) reaches 2048, temp_dep_counter's $12^{th}$ bit (shown as done_vco_indep) is asserted. This causes the 12-bit count register (92) to stop counting. A first synchronizer (96) synchronizes the time phase of done_vco_indep to the time phase of the temp_dep_freq and outputs the phase-adjusted version of done_vco_indep as a new signal called done_vco_dep. The complement of done_vco_dep, i.e., a low, is inputted to the 11-bit count register (102) at an enable port. Because the signal at the enable port is a low, the 11-bit count register (102) is disabled, and the value of temp_dep_counter can no longer be updated. Thus, the value of temp_dep_counter is dependent on the value of temp_indep_counter. As a result, any inaccuracies, such as process variations, present in both temp_dep_freq and temp_indep_freq, do not affect the value of temp_dep_counter because temp_dep_counter is referenced against temp_indep_counter.

A second synchronizer (108) is used to synchronize the time phase of done_vco_dep to a low frequency version of the integrated circuit's core clock signal (shown as a chip_clk signal). This low frequency version is produced by feeding chip_clk through a clock divider (110). When a first edge detector (106) detects a positive edge transition in the synchronized version of done_vco_dep, a load_enable signal of an 11-bit shift register (104) is asserted along with a data_ready signal of the first edge detector (106). The assertion of load_enable allows the most recently saved value of temp_dep_counter to be loaded from the 11-bit count register (102) into the 11-bit shift register (104) at a load_data port. Once the most recently saved value of temp_dep_counter has been loaded, the 11-bit shift register (104) contains a digital word representing a difference between temp_indep_freq and temp_dep_freq. The assertion of the data_ready signal lets the integrated circuit know that the 11-bit shift register (104) is ready to shift the digital word out of the comparator.

A serial_data_out signal containing the digital word is shifted out through the 11-bit shift register's data_out port when a serial_shift_en signal from the integrated circuit asserts the 11-bit shift register's shift_enable signal. Once a digital word is shifted out of the comparator, the temperature measurement that the digital word represents may be utilized by an on-chip or off-chip digital system. Simultaneously, data from a serial_data_in signal is shifted into the 11-bit shift register (104) at a data_in port. In some embodiments, data shifted into the 11-bit shift register (104) through serial_data_in may contain a digital word representing a temperature measurement taken by another temperature sensor residing on the integrated circuit. As long as data is being shifted through the 11-bit shift register (104), the serial_shift_en signal remains asserted. While serial_shift_en is asserted, no data can be loaded into the 11-bit shift register (104) through the load_data port.

Meanwhile, because done_vco_indep has been asserted, i.e., is high, the value of the temp_indep_counter saved by the 12-bit count register (92) is reset to zero. As a result, done_vco_indep is de-asserted, which, in turn, causes done_vco_dep to be de-asserted. When a second edge detector (98) detects the de-assertion, i.e., a negative edge transition, of done_vco_dep, the 11-bit count register (102) is re-enabled and the reset input of the 11-bit count register (102) is asserted. This causes the value of the temp_dep_counter saved by the 11-bit count register (102) to be reset to zero as well. Thus, the comparator is ready to generate a new digital word.

Advantages of the present invention may include one or more of the following. In some embodiments, because frequency pulses in a temperature-dependent oscillating frequency and a temperature-independent oscillating frequency are counted on-chip, a temperature-independent voltage and a temperature-dependent voltage may be quantified on-chip.

In some embodiments, because a temperature-independent oscillating frequency is used as a reference in nodal voltage quantification technique, process variations present in a voltage-controlled oscillator may be canceled from a temperature-dependent oscillating frequency.

In some embodiments, because a digital word proportional to a difference between a temperature-dependent voltage and a temperature-independent voltage is generated on-chip, temperature measurements represented by the temperature-dependent voltage may be accessed by an on-chip digital system.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An apparatus for quantifying a difference in voltage between a first node and a second node, comprising:
   a voltage generator arranged to concurrently generate a temperature-independent voltage on the first node and a temperature-dependent voltage on the second node;
   a first oscillator that inputs the temperature-independent voltage, wherein the first oscillator generates a first oscillating frequency based on the temperature-independent voltage;
   a second oscillator that inputs the temperature-dependent voltage, wherein the second oscillator generates a second oscillating frequency based on the temperature-dependent voltage; and
   a comparator that counts a first number of pulses of the first oscillating frequency during a fixed time interval, counts a second number of pulses of the second oscillating frequency during the fixed time interval, determines a difference between the first number and the second number, and generates a digital word dependent on the difference, wherein a value of the digital word is proportional to the voltage difference between the first node and the second node.

2. The apparatus of claim 1, wherein the first oscillating frequency oscillates at a higher frequency than the second oscillating frequency.

3. The apparatus of claim 1, wherein the second oscillating frequency is dependent on a temperature in the voltage generator.

4. The apparatus of claim 3, wherein the first oscillating frequency is substantially independent of the temperature in the voltage generator.

5. An apparatus for quantifying a difference in voltage between a first node and a second node, comprising:

a voltage generator for concurrently generating a first nodal voltage on the first node and a second nodal voltage on the second node;

means for generating a first oscillating frequency based on the first nodal voltage;

means for generating a second oscillating frequency based on the second nodal voltage;

means for counting a first number of pulses of the first oscillating frequency during a fixed time interval;

means for counting a second number of pulses of the second oscillating frequency during the fixed time interval;

means for determining a difference between the first number and the second number; and means for generating a digital word dependent on the difference, wherein a value of the digital word is proportional to the voltage difference between the first node and the second node.

6. A method for quantifying a difference in voltage between a first node and a second node, comprising:

concurrently generating with a voltage generator a first nodal voltage on the first node and a second nodal voltage on the second node generating a first oscillating frequency based on the first nodal voltage, wherein the first oscillating frequency is generated with a first oscillator;

generating a second oscillating frequency based on the second nodal voltage, wherein the second oscillating frequency is generated with a second oscillator;

counting a first number of pulses of the first oscillating frequency during a fixed time interval;

counting a second number of pulses of the second oscillating frequency during the fixed time interval;

determining a difference between the first number and the second number; and generating a digital word dependent on the difference, wherein a value of the digital word is proportional to the voltage difference between the first node and the second node.

* * * * *